United States Patent [19]

Eumurian

[11] Patent Number: 4,633,525
[45] Date of Patent: Dec. 30, 1986

[54] LIGHT-EMITTING DIODE DEVICE FOR SUPPRESSING THERMAL TIME-CONSTANT EFFECTS

[75] Inventor: Grégoire Eumurian, Argenteuil, France

[73] Assignee: Thomson CSF, Paris, France

[21] Appl. No.: 560,115

[22] Filed: Dec. 12, 1983

[30] Foreign Application Priority Data

Dec. 14, 1982 [FR] France ............... 82 20965

[51] Int. Cl.⁴ .......................... H04B 9/00
[52] U.S. Cl. ....................... 455/613; 372/29; 372/34; 372/38; 455/618
[58] Field of Search .......... 455/606, 609, 613, 617, 455/618, 608, 611; 307/310, 311; 372/36, 38, 29, 34; 332/7.51

[56] References Cited

U.S. PATENT DOCUMENTS

| | | | |
|---|---|---|---|
| 3,946,335 | 3/1976 | De Loach, Jr. et al. | 372/38 |
| 3,947,753 | 3/1976 | Gushima et al. | 340/653 |
| 4,412,331 | 10/1983 | Chapman | 372/38 |
| 4,433,238 | 2/1984 | Adolfsson et al. | 250/231 R |

FOREIGN PATENT DOCUMENTS

| | | | |
|---|---|---|---|
| 57-39593 | 3/1982 | Japan | 372/38 |
| 58-7941 | 1/1983 | Japan | 455/613 |

OTHER PUBLICATIONS

Lynch, R. J. et al, "Optical Transducer", *IBM Technical Journal*, vol. 12, No. 6, Nov. 1969, pp. 873, 874.

*Primary Examiner*—Joseph A. Orsino, Jr.
*Attorney, Agent, or Firm*—Cushman, Darby & Cushman

[57] ABSTRACT

A device for controlling a light-emitting diode. The light-emitting diode is reverse-biased in order to be put out of service without light emission, a reverse current of predetermined value being passed through the diode in order to produce a dissipation of electric power equivalent to the value dissipated in the light-emitting mode, thus maintaining the temperature of the junction. This quiescent state can be achieved by means of a switching assembly and the emissive state can be produced by a current source. When mounted on an optical bus, this arrangement makes it possible to maintain the signal-to-noise ratio by reason of the fact that only one diode emits each time while the other diodes remain in the quiescent state.

10 Claims, 5 Drawing Figures

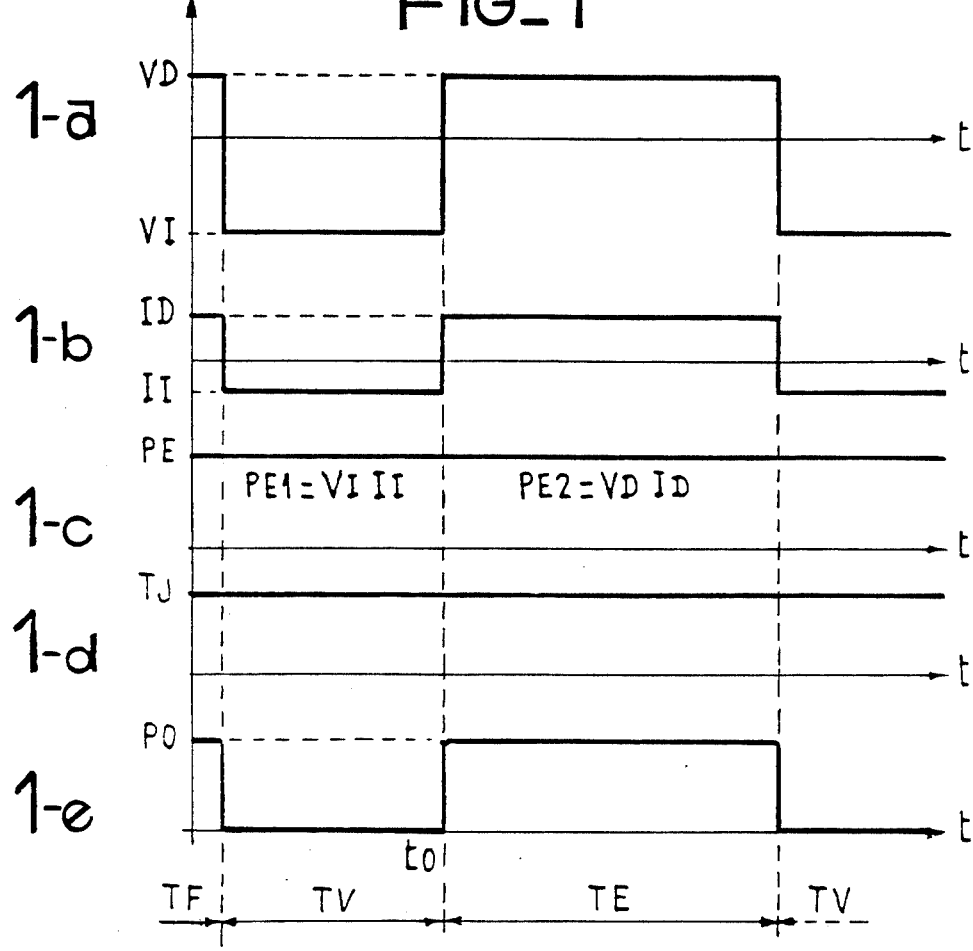
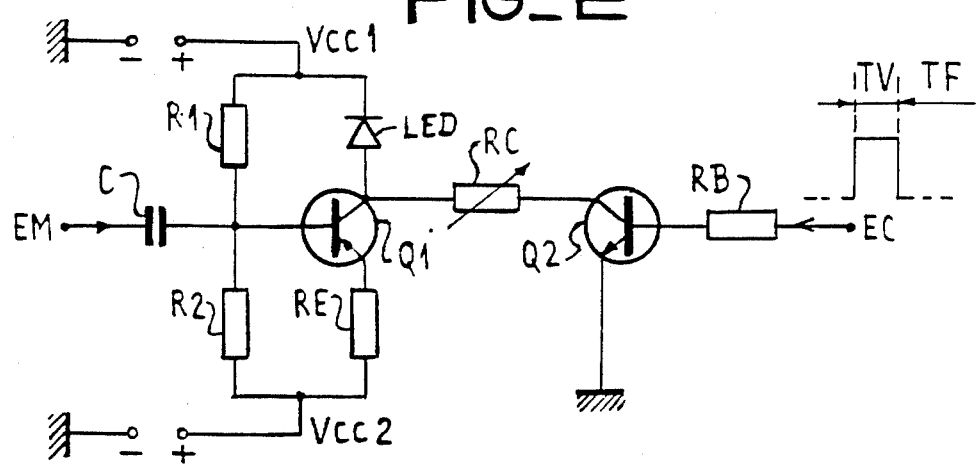

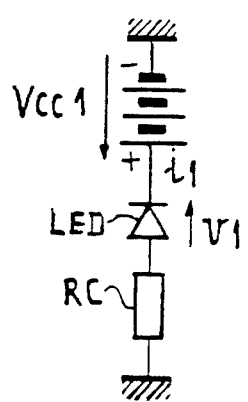
FIG_3
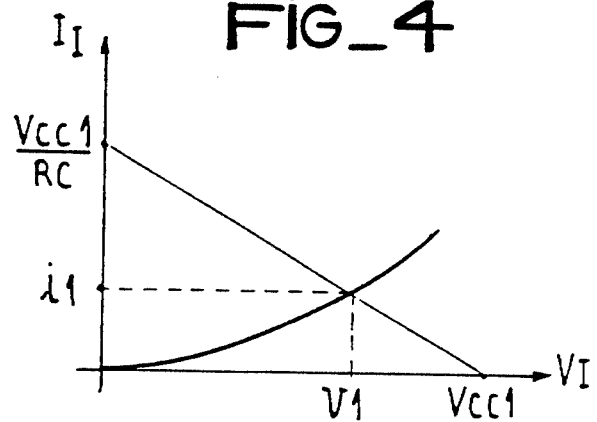
FIG_4
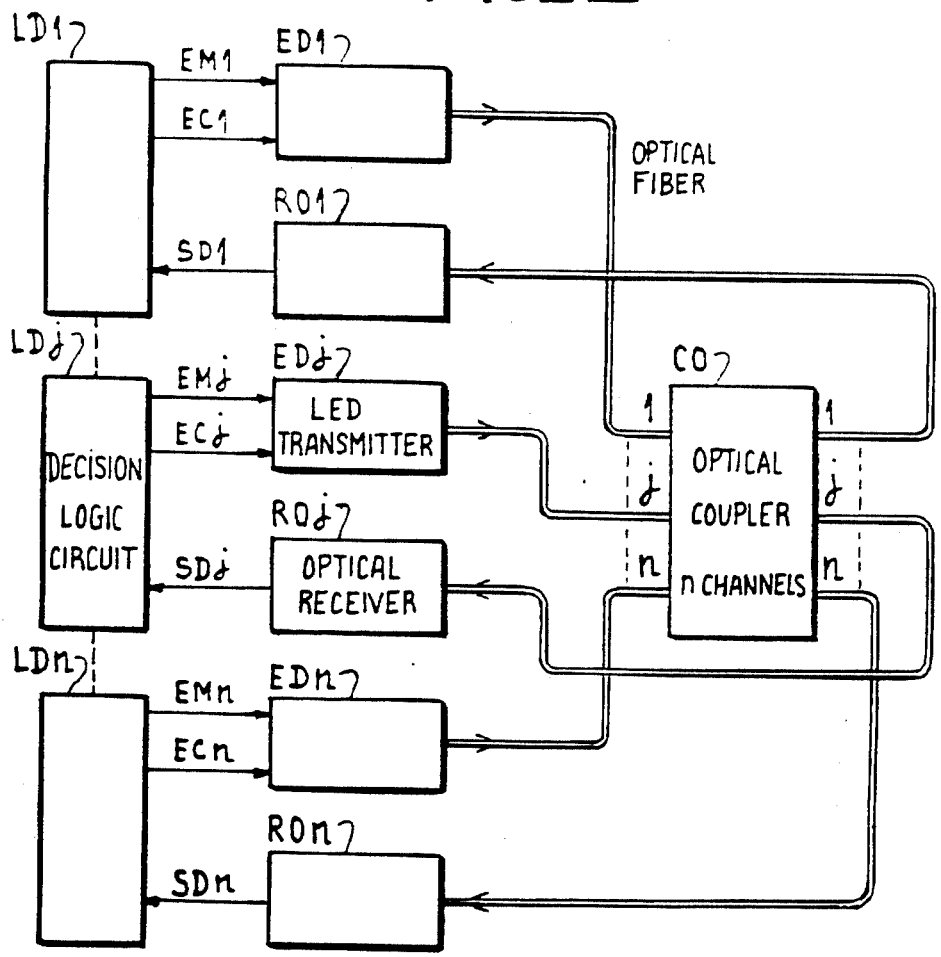
FIG_5

LIGHT-EMITTING DIODE DEVICE FOR SUPPRESSING THERMAL TIME-CONSTANT EFFECTS

BACKGROUND OF THE INVENTION

1. Field of the Invention

This invention relates to a light-emitting diode device designed to suppress thermal time-constant effects.

2. Description of the Prior Art

A light-emitting diode (usually abbreviated to LED) is one of the most widely employed components in optical-fiber transmission systems. This component in fact exhibits a linear current-power response characteristic and modulation of optical power by variation of the current can be obtained over a broad frequency range, the high frequencies being easily in the vicinity of 150 to 200 MHz under present technological conditions.

Transmission systems or optical buses usually employ a plurality of light-emitting diode (LED) transmitters as well as a plurality of optical receivers, each receiver being equipped with a PIN-photodiode or with an avalanche photodiode.

A few properties of optical transmitting and receiving devices will first be recalled in order to facilitate the following description and to gain a more complete understanding of the general object of the invention.

In the case of an analog transmission, the light-emitting diode (hereinafter designated as LED) is forward-biased with a current Io corresponding to the mean value of the modulation zone traversed on the current-power characteristic. Modulation is performed by varying the current and therefore the power on each side of this mean value.

In the case of digital transmission, it is possible to perform a modulation with respect to zero. For example, I=0 and P=0 represent the logical "zero" and I=I1 and P=P1 represent the logical "one". However, in the case of most LEDs, an all-or-none modulation produces a poor pulse response and it is preferable to perform a modulation with two levels, which is equivalent to biasing at the mean current value Io. This mean value is advantageously employed in the frequent cases of three-level coding of the transmission in order to define the third level or intermediate level, the other two being those which correspond to state "one" and to state "zero".

After optical-fiber transmission, the power is demodulated by means of a photodiode. This photodiode is either of the PIN type or of the avalanche type. In both cases, the optical noise depends on the value of the mean modulation power.

In order to obtain the highest signal-to-noise ratio, it is necessary to produce maximum modulation of the LED and to minimize the mean optical power.

If the light which arrives at the receiver comes from a single transmitter, the ratio between these two parameters which defines the modulation ratio is constant and within the range of 0 to 100% (a typical value being 50%). In respect of a fixed value of the modulation ratio, the signal-to-noise ratio increases as the square root of the mean power.

If the light arriving at the receiver comes from a plurality n of transmitters (as is the case with optical buses), the signal-to-noise ratio is given by a relation which employs $$\frac{\Delta P_i}{\sqrt{P_{o1} + \ldots + P_{oi} + \ldots + P_{on}}}$$

where $\Delta P_i$ is the modulation of the transmitter i and $P_{oi}$ is the mean power emitted by the transmitter i. The modulation of the transmitter is thus liable to be masked by the noise produced by all the transmitters 1 to n. The degradation of the dynamic range is proportional to $\sqrt{n}$ in the case of powers which are considered equal since in this case, the ratio may be written $$\frac{\Delta P_i}{\sqrt{nP_o}}.$$

The electric power $PE = I \times VD$ dissipated by a LED depends on the current I injected into the diode and also on its voltage drop VD. This power, which is dissipated at the level of the junction, produces a temperature rise which in turn causes a drop in the emitted optical power. The junction temperature TJ depends on the electric power PE, on the ambient temperature TA, on the junction-ambient heat resistance $Rth_{J-A}$ and can be expressed in the form:

$$Tj = PE \times Rth_{J-A} + TA$$

If the electric power applied to the diode varies as a function of time, the junction temperature follows with a time constant which can be defined by the product $$Rth_{J-A} \cdot Cth_{J-A}$$

where $Cth_{J-A}$ represents the junction-ambient heat capacity.

A variation in the emitted optical power corresponds to the aforementioned time-dependent variation in the junction temperature and is an undesirable parasitic effect which interferes with the modulation of the diode.

SUMMARY OF THE INVENTION

It is an object of the present invention to provide a remedy for the above-mentioned thermal time-constant effect and also for degradation of the signal-to-noise ratio in an application involving the use of a plurality of optical transmitters and receivers (optical buses).

In such applications, the system can in fact be arranged so as to operate in two different modes:

In a first mode, one transmitter alone is modulated but all the other transmitters emit their mean power. In this case, all the transmitters are biased but only the transmitter selected for transmission is modulated. Thus a transmitter in the standby state (which is therefore already biased) does not exhibit its thermal time constant at the moment of switchover for transmission since its mean power is continuously established at the value of equilibrium. The receiver, however, receives the mean optical power emitted by all the transmitters and produces a maximum noise level. In the case of ten transmitters of equal power, for example, the signal-to-noise ratio suffers a loss of 10 dB.

In a second possible mode of operation, a single transmitter is modulated whereas all the other transmitters are cut-off. In this case, the signal-to-noise ratio at the level of the receiver is not impaired. But each time a transmitter is selected, it is necessary to allow a relatively long time interval to elapse before thermal stabilization can take place. In the case of a high data-rate transmission (10 to 100 Mbits/s), this idle period can represent several millions or billions of bits.

It is therefore apparent that neither of these two modes of operation provides a solution for multiple-transmitter systems.

A solution in accordance with the invention makes it possible to obtain a signal-to-noise ratio which is as high as in the second operating mode but with a switchover speed which is close to that of the first mode.

In accordance with the invention, a light-emitting diode device is proposed and comprises a means for turning-on and modulating the diode upon reception of a modulating signal. Said turn-on means produces forward-biasing of the diode in order to obtain an emission of photons which are modulated in accordance with the signal. The device further comprises means for turning-off the diode during the time intervals which elapse between the transmission periods. The distinctive feature of the device lies in the fact that the turn-off means are so designed as to reverse-bias the diode by dissipating into the pn junction on which it is constructed, an electric power substantially equal in value to the electric power dissipated therein during each transmission. The diode is thus put in a quiescent state during which transmission is blocked while ensuring a junction temperature corresponding to the temperature during transmission, thus making it possible to prevent any thermal time constant effect at the junction.

BRIEF DESCRIPTION OF THE DRAWINGS

Other features of the invention will be more apparent upon consideration of the following description and accompanying drawings, wherein :

FIGS. 1-a–1e shows the waveforms relating to the operation and to the method employed;

FIG. 2 is a circuit diagram corresponding to an exemplified embodiment of a light-emitting diode or LED device in accordance with the invention;

FIG. 3 is a partial diagram of the circuit of FIG. 2 relating to the equivalent circuit in the quiescent state;

FIG. 4 is the inverse current-voltage characteristic of the LED and shows the determination of the operating point; and FIG. 5 is a diagram of one application of the LED device in accordance with the invention to an optical bus.

DETAILED DESCRIPTION OF THE INVENTION

The method employed consists in reverse-biasing the LED throughout the quiescent period in such a manner as to ensure that the electric power dissipated at the level of the diode junction is identical with the electric power to be subsequently dissipated when said diode will be forward-biased or in other words during an operating period.

In a first stage (standby stage or quiescent period), the diode is reverse-biased and there is no optical transmission. On the other hand, the junction is already at the operating temperature which is necessary for the second stage (transmission stage).

Under these conditions, the diode does not emit light in the quiescent state, which does not increase the noise at the level of the receiver. During the transmission stage, since the junction temperature is correct, no thermal time constant is liable to delay the state of equilibrium.

The waveforms in FIGS. 1-a to 1-e illustrate this operating mode.

FIG. 1-a represents the voltage VI at the terminals of the diode when this latter is reverse-biased (standby or quiescent period TV) and the voltage VD when the diode is forward-biased (operating period or transmission period TE). FIG. 1-b relates to the current which passes through the diode, as designated respectively by the references $I_I$ and $I_D$. FIG. 1-c shows the equalization of the reverse electric power $PE_I$ and the forward electric power $PE_D$, and FIG. 1-d shows the unchanged temperature TJ of the junction. The transmitted optical power PO is illustrated in FIG. 1-e. This optical power is zero during each quiescent period TV as a result of blocking the transmission by reverse-biasing, but immediately attains the desired value at the instant to of transition to the operating state by reason of the fact that the junction temperature has been maintained during the preceding stage TV. The value PO corresponds to the mean power value.

FIG. 2 shows one example of construction of a LED device in accordance with the invention. The device shown in the form of an electric circuit comprises the LED proper, a modulation input EM, a control input EC, two transistors Q1 and Q2, a capacitor C and the resistors R1, R2, RE and RC.

The LED is forward-biased by the current source formed by the p-n-p transistor Q1, the resistors RE, R1, R2 and a direct-current voltage VC having a polarity which is suited to the circuit terminals. This voltage is obtained by means of the two direct-current potentials Vcc1 and Vcc2 which are positive in the case under consideration and are applied to the resistor branch or pair of resistors R1 and R2 respectively. The voltage VC thus produced is equal to Vcc2-Vcc1 since it is assumed that Vcc2 is higher than Vcc1. Thus, by way of example, Vcc2=10 V and Vcc1=5 V. The branch R1-R2 serves to bias the base of the transistor Q1 and determines the mean current Io within the LED which loads the collector. Modulation is applied to the input EM and transmitted to the base of transistor Q1 via capacitor C in order to vary the bias and correlatively the current through the transistor and the diode and to modulate the emission of photons.

Reverse-biasing is performed by a switch which has the design function of connecting the diode to the terminals of the direct-current supply Vcc1. The switching circuit is composed of the transistor Q2 and of the resistors RC and RB.

In order to produce the quiescent state, a positive voltage is applied to the input EC. This results in conduction of the transistor Q2 in the saturating mode and leads to consideration of the resistor RC connected on this side of ground as indicated in FIG. 3. The resistors RB and RC serve to limit the currents. The LED is then reverse-biased by the voltage Vcc1.

FIG. 4 shows the current-voltage characteristic of the reverse-biased LED as well as the load line relating to the resistor RC. The operating point $v_1$, $i_1$ can be adjusted by varying Vcc1 and/or RC so that the dissipated electric power $PE1 = v_1 \times i_1$ during the standby stage TV, corresponds to the dissipated electric power PE2 of the transmission stage. Since the diode is reverse-biased, there is no light emission.

In order that a transmission stage TE may then be carried out, the control voltage applied to the input EC drops to OV or to a slightly negative value in order to cause the transistor Q2 to cut-off and the LED circuit is again re-formed through the transistor Q1. The LED is biased by the current source Q1, R1, R2, RE and the forward current value is given by:

$$I_D = \left[ (V_{cc2} - V_{cc1}) \cdot \frac{R2}{R1 - R2} - (V_{BE})Q1 \right] \frac{1}{RE}$$

where $(V_{BE})Q1$ is the voltage between base and emitter of the transistor Q1. The voltage VD at the terminals of the diode depends on the current ID only to a limited extent and is usually in the vicinity of 2 V. The dissipated electric power PE2 is equal to ID×VD.

If the current ID on the one hand and Vcc1 and RC on the other hand are selected in order to ensure that the values of dissipated power PE1 and PE2 are substantially equalized, the temperature of the junction will undergo practically no change at the moment of transition from the quiescent state (LED reverse-biased; no light emission) to the operating state (LED forward-biased; light emission) and the assembly will not exhibit any thermal time constant.

In an application to an optical bus, the fact that the diodes which are non-operational at a given instant are not emissive results in reception of only one light signal at a time, namely the signal of the LED of the operational transmitter, and prevents degradation of the signal-to-noise ratio in the following ratio $$\sqrt{\frac{Po1 + \ldots + Poi + \ldots - Pon}{Poi}}$$

which becomes $\sqrt{n}$ in the case of n identical transmitters.

FIG. 5 illustrates one example of the application considered in the foregoing. The transmission system comprises n channels each consisting of one LED transmitter EDj, one optical receiver ROj and one decision logic LDj. There are shown the inputs for initiating one state or the other and the detection output SDj of the receiver. The decision circuits LD1 to LDn are controlled from a central unit (not shown), if only to manage message transmissions in time. The optical interconnections can be established with an optical coupler CO such as, for example, a mixing bar to which the transmitters and receivers are connected by optical fibers.

What is claimed is:

1. A device for controlling a light-emitting diode, said diode having emission periods and non-emission periods, comprising:
   means for turning-on and modulating said diode, said turning-on means having a first input terminal for receiving a modulation signal, said diode being forward-biased by said turning-on means and providing a photon emission modulated in accordance with said modulating signal; and
   means for turning-off said diode, said turning-off means having a second input terminal for receiving a control pulse signal to control said non-emission periods, said turning-off means reverse-biasing said diode and including adjustable means for adjusting the electric power dissipated in the reverse-biased diode to be substantially equal in value to the electric power dissipated in the forward-biased diode thus ensuring a diode junction temperature during non-emission periods substantially equal to the diode junction temperature during emission periods and preventing a thermal time constant effect at said diode.

2. A device according to claim 1, wherein said turning-on and modulating means includes a current source having a first transistor whose collector is connected to one electrode of said diode, and wherein said turning-off means includes a switch having a second transistor whose collector is connected to said electrode of said diode through said adjustable means, said adjustable means including a resistor.

3. A device according to claim 2, wherein said resistor is adjustable in order to regulate said substantial equality of dissipated electric power values.

4. A device according to claim 2, wherein two direct-current voltages are supplied to said turning-on and modulating means and include a first direct-current voltage applied to a second electrode of said diode, and a second direct-current voltage applied to an emitter electrode of said first transistor through a resistive element.

5. A device according to claim 3, wherein two direct-current voltages are supplied to said turning-on and modulating means and include a first direct-current voltage applied to a second electrode of said diode, and a second direct-current voltage applied to an emitter electrode of said first transistor through a resistive element.

6. A device according to claim 4, wherein said second direct-current voltage is higher than said first direct-current voltage.

7. A device according to claim 4, wherein said first transistor is of the pnp type, said second transistor is of the npn type, and wherein said second direct-current voltage is higher than said first direct-current voltage.

8. An optical transmission system including an optical bus which interconnects a plurality n of stations, each station including (a) a light-emitting diode, (b) an optical receiver, and (c) a device for controlling the light-emitting diode according to claim 1, and further including control means for causing each diode to transmit information while other diodes are in a standby mode and are reverse-biased and thus emit no light which would increase a level of noise within said optical receivers installed in said stations, and to cause the diodes in standby mode to be reverse-biased in order to heat their junctions at a moment of optical transmission, thus avoiding any delay caused by said thermal time constant.

9. A device for controlling a light-emitting diode, said diode having emission periods and non-emission periods, comprising:
   means for turning-on and modulating said diode upon reception of a modulating signal at a first input terminal coupled to the turning-on means, said diode being forward-biased by said turning-on means and providing photon emission modulated in accordance with said modulating signal; and
   means for turning-off said diode, and for preventing thermal time constant effects, said turning-off means having a second input terminal and being controlled by a pulse signal applied to said second input terminal during each non-emission period, said turning-off means reverse biasing said diode to dissipate therein an electric power substantially equal in value to the electric power dissipated therein during each emission period and thus placing said diode in a non-emission period during which emission is blocked while causing a junction temperature of the reverse-bias diode to be substantially equal to a junction temperature of the forward-biased diode.

10. Apparatus for controlling a light-emitting diode, said diode having emission periods and non-emission periods, comprising:

means for turning-on and modulating said diode, said turning-on means including (a) a first input terminal receiving a modulating signal, (b) a first voltage input terminal providing a first voltage, (c) a second input terminal providing a second voltage greater than said first voltage, said turning-on means biasing said diode and stimulating photon emission from said diode in accordance with said modulating signal; and means for turning-off said diode, said turning-off means having a second input terminal receiving a control signal, said turning-off means reverse biasing said diode in accordance with said control signal, said turning-off means causing a dissipation of electric power in said diode during said non-emission periods to be substantially equal to a dissipation of electric power in said diode during said emission periods thereby causing a junction temperature of said diode to be substantially constant during periods of emission and non-emission.

* * * * *